United States Patent
Pintchovski et al.

[11] Patent Number: 6,127,257
[45] Date of Patent: Oct. 3, 2000

[54] METHOD OF MAKING A CONTACT STRUCTURE

[75] Inventors: Faivel S. Pintchovski; John R. Yeargain; Papu D. Maniar, all of Austin, Tex.

[73] Assignee: Motorola Inc., Schaumburg, Ill.

[21] Appl. No.: 08/154,366

[22] Filed: Nov. 18, 1993

[51] Int. Cl.⁷ ............................................... H01L 21/4763
[52] U.S. Cl. ........................ 438/625; 438/635; 438/637; 438/648; 438/650; 438/656; 438/685; 438/686; 438/687; 438/688
[58] Field of Search .................................. 437/190, 201; 438/625, 635, 637, 648, 650, 656, 685, 686, 687, 688

[56] References Cited

U.S. PATENT DOCUMENTS

| | | | |
|---|---|---|---|
| 4,851,895 | 7/1989 | Green et al. | 427/126.5 |
| 4,962,060 | 10/1990 | Sliva et al. | 437/192 |
| 4,980,034 | 12/1990 | Volfson et al. | 204/384 |
| 4,980,752 | 12/1990 | Jones, Jr. | 357/71 |
| 5,000,818 | 3/1991 | Thomas | 156/643 |
| 5,003,428 | 3/1991 | Shepherd | 361/321 |
| 5,200,360 | 4/1993 | Bradbury et al. | 437/192 |

FOREIGN PATENT DOCUMENTS 63-314851  12/1988  Japan ..................................... 437/198

OTHER PUBLICATIONS

J. Armstrong, "Transition Metal Oxide Conductors in Integrated Circuits", *IBM Technical Disclosure Bulletin* vol. 20, No.11A (Apr., 1978) pp 4633.

Vadimsky, R.G., et al., "Ru and $RuO_2$ as Electrical Contact Materials", J. Electrochem. Soc., Nov. 1979, vol. 126, 11, pp. 2017–2023.

M.L. Green, et al., "Chemical Vapor Deposition of Ruthenium and Ruthenium Dioxide Films", J. Electrochem. Soc., (132), 11, p. 2677, (1985).

Vadimsky, R.G., et al., "Ru and RuO2 as Electrical Contact Materials", J. Electrochem. Soc., Nov. 1979, vol. 126, No. 11, pp. 2017–2023.

Vossen et al., Thin Film Processes, Academic Press, 1978, pp. 12–13.

Wolf, et al., Silicon Processing for the VLSI Era, Lattice Press, vol. 1, 1986, pp. 169–174.

*Primary Examiner*—John F. Niebling
*Assistant Examiner*—Lynne A. Gurley

[57] ABSTRACT

An improved contact structure and process for forming an improved contact structure for a semiconductor device. A metal (14) is formed on a first metal layer (12) positioned on a substrate (10) The metal (14) is a Group VIIB or Group VIII metal or metal oxide and increases the electrically conductive surface area (25) of the first metal layer (12). In one embodiment, a Group VIIB or Group VIII metal layer is deposited onto the first metal layer and the Group VIIB or Group VIII metal layer is anisotropically etched to form sidewall spacers (24). An insulating layer (16) is deposited overlying the first conductive layer (12) and the sidewall spacers (24). A via opening (18) is formed in the insulation layer (16) to expose a portion of the electrically conductive surface area (25). A second metal layer (22) fills the opening (18) and forms a metallurgical contact to the first metal layer (12).

14 Claims, 3 Drawing Sheets

METHOD OF MAKING A CONTACT STRUCTURE

FIELD OF THE INVENTION

This invention relates in general to semiconductor devices and processes for fabricating semiconductor devices, and more particularly to an improved contact structure, and to a process for forming a contact structure in a semiconductor device.

BACKGROUND OF THE INVENTION

As semiconductor devices become more complex and include more and more components, it becomes necessary to develop new structures and fabrication techniques which minimize the overall size of the device. One such technique for reducing the physical size of the device is to form multi-layered structures where metal interconnects overlay one another and are separated from each other by interlevel dielectric layers. The overlying metal interconnects are electrically coupled with each other and with conductive structures on the substrate surface through via holes and contact openings in the interlevel dielectric layers. As the size of the device is reduced, the contact and via holes must necessarily be made smaller and placed closer together; but, the thickness of the interlevel dielectric material must continue to be sufficient to electrically isolate the overlying metal interconnects. The competing requirements for a small via diameter and a thick isolation layer increases aspect ratio (depth/diameter) of the via holes.

The small diameter of the vias and the relatively thick interlevel dielectric layer makes the formation of a highly reliable contact structure difficult. Not only must a small opening be formed in a thick dielectric material, but also, a low electrical contact resistance must be achieved. In addition, the number and complexity of the processing steps must be held to a minimum to keep manufacturing costs low. A particular problem develops where, for example, electrically resistive materials form over an underlying metal layer to which a contact opening has been formed. To avoid excessive contact resistance, the electrically resistive material must be removed prior filling the via with another metal layer. The resistive material is often removed by an insitu cleaning process immediately prior to deposition of the overlying metal layer. Typically, the resistive material is sputtered away or reactively etched using energetic atoms and ions. So long as the size of the via opening is large, the resistive surface layers on the metal are removed, leaving a clean metal surface. However, in the case of a via having a high aspect ratio, material being removed from the surface of the metal impacts the sidewall of the via dislodging insulative material from the sidewall. Once dislodged from the sidewall, the insulative material falls to the exposed metal surface and reforms a resistive layer. Thus, the insitu cleaning process is defeated by a self-generated mechanism.

From another perspective, high-aspect ratio vias are also difficult to form because of their small diameter and the need to place them in precise locations. The via opening must be formed over a predetermined contact site on an a structure underlying the insulating layer. If the via opening is misaligned to the contact site, when the via is filled an ohmic contact may not be formed because the misalignment causes a reduction in electrically conductive surface area in the contact. This is because a portion of the metal filling the via contacts insulating material instead of the conductive material at the contact site. If the via opening is completely misaligned an open is created in the circuit causing complete device failure.

As the trend toward fabrication of devices having smaller feature sizes and higher performance continues, better materials and processes must be used to avoid processing problems such as that describe above. The careful selection of proper materials can achieve both better device performance, and minimize production costs by reducing the need for special processing steps.

SUMMARY OF THE INVENTION

In practicing the present invention, there is provided an improved contact structure and process for forming the contact structure in a semiconductor device. In one embodiment, a substrate is provided having a first metal layer formed thereon. A Group VIIB or Group VIII metal selected from the group consisting of ruthenium, rhodium, rhenium, and iridium is formed on the first metal layer to increase the electrically conductive surface area of the first metal layer. An insulating layer is formed on the Group VIIB or Group VIII metal layer and a via opening is formed in the insulating layer exposing a portion of the Group VIIB or Group VIII metal layer. A second metal layer is directly deposited into the opening making contact to the exposed portion of the Group VIIB or Group VIII metal layer. The second metal layer can be deposited in the absence of a pre-cleaning step that is typically performed to remove non-electrically conductive oxide from the surface of the exposed metal. The pre-cleaning step is not necessary because an oxide which forms on the Group VIIB or Group VIII metal layer is electrically conductive. Additionally, the increased electrically conductive surface area can alleviate the high contact resistance caused by a partial misalignment of the via opening to the underlying first metal layer.

Figure 1:
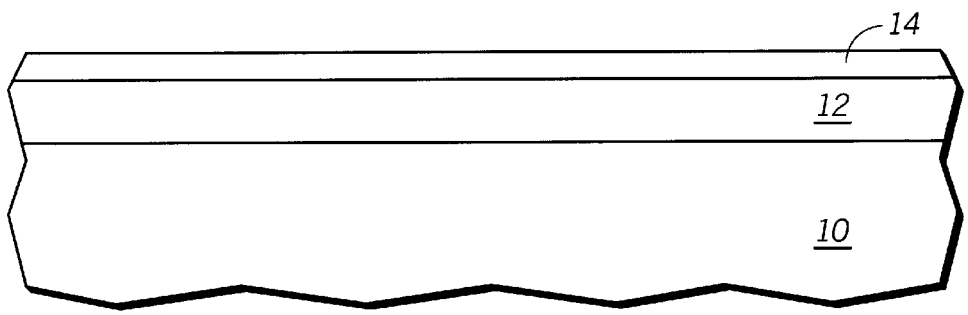
FIGS. 1–4 illustrate, in cross-section, process steps in accordance with one embodiment the invention.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

Figure 2:
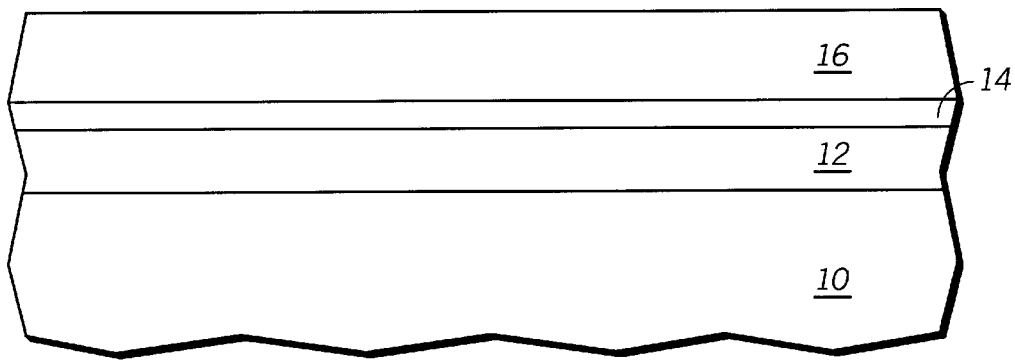
Figure 3:
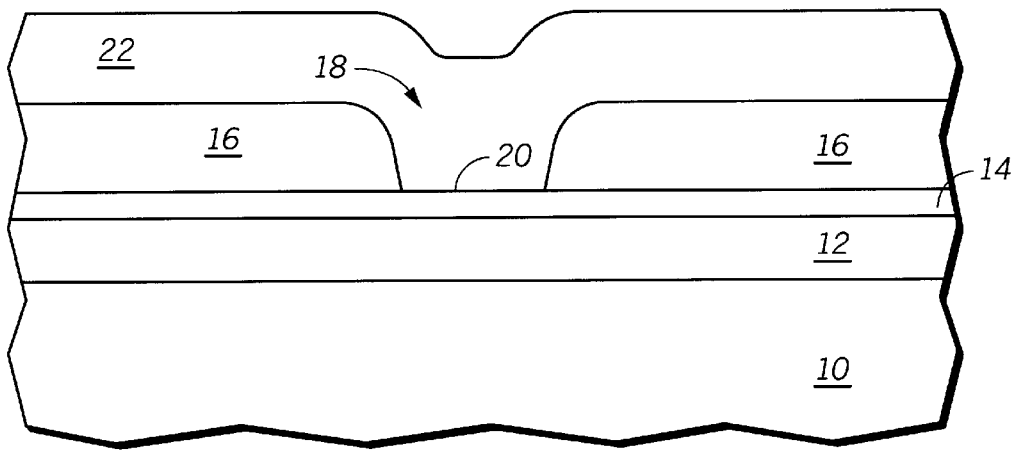

The ideal contact or via formation process is one in which a low resistance contact is made between an overlying metal lead and an underlying conductive structure. To achieve a low contact resistance, it is important to insure that an intervening resistive material is not present at the interface between the metal lead and the conductive structure. If a resistive material is present on the surface of the conductive structure, it must be removed before the formation of the metal contact. In accordance with the invention, a process is disclosed which provides a contact structure which avoids the formation of a resistive material at the metal interface by forming a conductive oxide at the contact interface. Process steps in accordance with one embodiment of the invention are illustrated in FIGS. 1–3.

Shown in FIG. 1, in cross-section, is a portion of a semiconductor device having already undergone some of the process steps in accordance with the invention. A substrate 10 supports a first metal layer 12. First metal layer 12 is a portion of a metal interconnect layer overlying substrate 10 and supplying electrical signals to device components in the underlying substrate (not shown). Substrate 10 includes semiconductor materials such as single crystal silicon, polysilicon, gallium arsenide, and the like, patterned to form active devices. Additionally, substrate 10 includes an insulating material such as silicon oxide, silicon nitride, aluminum oxide, and the like, overlying the active devices. First metal layer 12 can be one of a number of commonly used conductive materials found in semiconductor devices. For example, first metal layer 12 can be an alloy such as a silicon-aluminum alloy having one to five weight percent silicon, or, a silicon-aluminum-copper alloy. Alternatively, first metal layer 12 can be a refractory metal such as tungsten, molybdenum, tantalum, titanium, and the like, or a refractory metal silicide. Additionally, first metal layer 12 can be a pure conductive metal such as aluminum or copper. Further, first metal layer 12 can be a semiconductor material.

A metal layer 14 overlies first metal layer 12. Metal layer 14 can be any metal which will form an electrically conductive oxide. In one embodiment of the invention, metal layer 14 is a metal selected from Group VIIB or Group VIII of the periodic table. Preferably, a layer of ruthenium, rhodium, rhenium, or iridium is formed by sputter deposition onto substrate 10. For example, a ruthenium (Ru) layer can be deposited on first metal layer 12 by DC sputter deposition. In one method, Ru is sputtered from a pure Ru target onto substrate 10. The Ru sputter deposition process forms a Group VIIB or Group VIII metal having a thickness of about 100 to 1000 angstroms on first metal layer 12. In an alternative method, Group VIIB or Group VIII metal layer 14 can be formed by organometallic chemical vapor deposition. For example, Ru can be deposited by pyrolysis of an organoruthenium complex such as bis(cyclopenta-dienyl) ruthenium ($Ru(C_5H_5)_2$), and triruthenium dodecacarbonyl ($Ru_3(CO)_{12}$), and the like. Alternatively, a halogenated compound such as ruthenium tetrachloride ($RuCl_4$) can be used as a source gas.

Following the formation of Group VIIB or Group VIII metal layer 14, substrate 10 can be removed from the sputter deposition system and can remain in storage awaiting further processing. Alternatively, substrate 10 can proceed directly to the next processing step while remaining in an inert, vacuum pressure environment. The present invention offers a distinct advantage for the formation of contact and via structures by covering first metal layer 12 with a metal which forms a conductive oxide. In the case of a Group VIIB or Group VIII metal, any native oxide layers, which form on the surface of the Group VIIB or Group VIII metal, are electrically conductive; therefore, the ambient oxidation of the Group VIIB or Group VIII metal does not present a processing difficulty.

In contrast to the present invention, contact and via formation processes of the prior art usually form the insulating layer directly over the surface of an aluminum metal interconnect. The aluminum oxide layer which forms on the surface of the aluminum is electrically resistive and must be removed prior to the deposition of an overlying metal interconnect layer. Further, all of the electrically conductive materials from which first metal layer 12 is constructed, readily oxidize in air to form a resistive oxide layer on the surface of the material. Once a resistive oxide surface layer forms, extra processing steps are required to remove the resistive oxide prior to the deposition of another metal layer. The present invention provides an improved contact formation process by eliminating the step of removing the resistive oxides.

The inventive process continues with the formation of an insulation layer 16 over Group VIIB or Group VIII metal layer 14, as illustrated in FIG. 2. Insulation layer 16 can be one of a number of different insulative materials commonly used in semiconductor device fabrication. For example, insulation layer 16 can be silicon oxide deposited by chemical vapor deposition from either a silane or tetraethylorthosilane (TEOS) source gas. Alternatively, insulation layer 16 can be a doped oxide layer such as phosphorus-silicate-glass (PSG) or boro-phosphorus-silicate-glass (BPSG). Further, insulation layer 16 can be a plasma deposited silicon oxide or silicon nitride material. Insulation layer 16 can be formed directly over any native oxide surface layer present on metal layer 14.

After metal layer 14 has been covered with insulation layer 16, a contact via opening 18 is formed in insulation layer 16, as shown in FIG. 3. The method used to form contact via opening 18 may vary depending upon, among other things, the materials of construction of insulation layer 16 and the aspect ratio of the contact opening to be formed. The aspect ratio is commonly defined as the thickness of the layer through which the opening is formed relative to the diameter of the opening. In advanced semiconductor devices the aspect ratio can be in the range of about 2:1 to as much as 4:1. The aspect ratio is large because the diameter of the contact opening is very small. However, in other cases, where a large contact opening is formed, the aspect ratio is in the range of about 0.5:1 to 1:1. Often, when the aspect ratio is small, a wet etch process can be used to form the opening. For example, in cases where the aspect ratio is small and insulation layer 16 is silicon oxide, a buffered hydrogen fluoride solution can be used to form contact via opening 18. In other cases, where the aspect ratio is large, a high-resolution, dry plasma etching process is used.

The plasma etch process is carried out by first photolithographically patterning then etching insulation layer 16 to expose a surface portion 20 of metal layer 14. For example, in the case where insulation layer 16 is silicon oxide, a plasma process using a fluorinated hydrocarbon such as fluoromethane can be used to form via opening 18. Those skilled in the art recognize that many other etch chemistries are possible depending upon the particular material that is to be etched.

The process of the present invention has the advantage that in either the wet etch or the dry plasma etch process described above, it is not necessary to remove a native oxide layer during or after the etching process. Additionally, a post etch treatment to form a protective layer over surface portion 20 is not necessary. Again, this is because an oxide layer which forms over exposed portion 20 of metal layer 14 is electrically conductive.

Following the formation of contact via opening 18, a second metal layer 22 is deposited onto insulation layer 16.

Second metal layer 22 fills via opening 18 and forms a metallurgical contact to the exposed portion of metal layer 14. Second metal layer 22 can be an alloy such as a silicon-aluminum alloy having a silicon content of one to five weight percent, or, a silicon-aluminum-copper alloy. Alternatively, second metal layer 22 can be a refractory metal such as tungsten, molybdenum, tantalum, titanium, and the like, and silicides thereof. Additionally, second metal layer 22 can be a metal such as aluminum, copper or gold.

Figure 4:
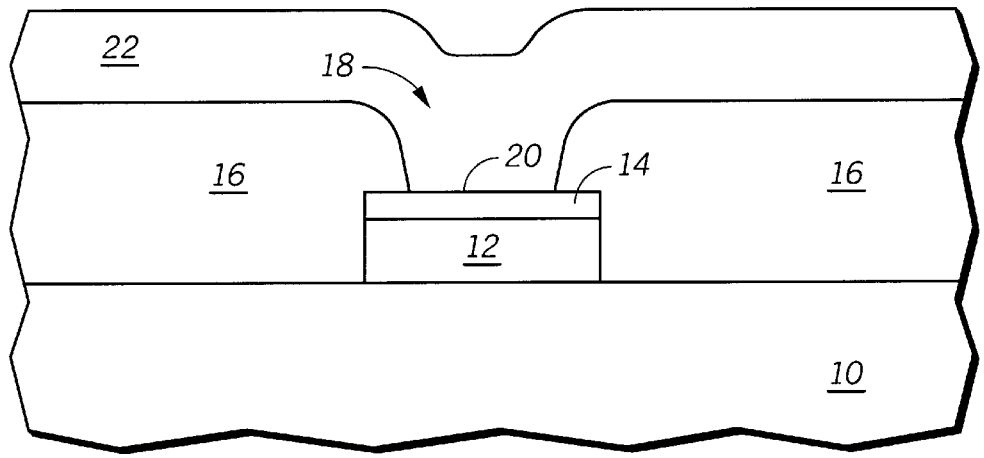

Another view of substrate 10 is illustrated in FIG. 4, which shows a cross-section of the patterned interconnect layer. The portion of the patterned interconnect layer illustrated in FIGS. 1–4 can be an individual metal interconnect lead, a substrate contact pad, or a metal plugs, or the like. The interconnect layer is formed on substrate 10 using a photolithographic masking process followed by an etching step. Insulation layer 16 is then formed over the patterned metal layer.

The presence of metal layer 14 overlying first metal layer 12 both simplifies the deposition process used to form second metal layer 22, and improves device performance. As previously described, an important feature of the present invention is that the deposition process used to form second metal layer 22 is carried out in the absence of a pre-cleaning step that is typically performed to remove non-electrically conductive oxides from surface portion 20. In processes of the prior art it is necessary to perform a pre-clean immediately prior to the deposition of the overlying conductive layer. This is because a native oxide formed on the underlying conductive layer is not electrically conductive and increases the contact resistance. High contact resistance is undesirable because it slows signal transmission times which adversely affects signal timing within the circuit. In extreme cases, complete device failure results from excessively high contact resistance.

To insure removal of all non-conductive oxides from the exposed conductive surface at the bottom the via opening, processes of the prior art use a sputter cleaning process to remove native oxide from the exposed surface. This sputter pre-clean process can adversely affect contact resistance by removing surface layers of insulative material from the sidewall of the contact opening and re-depositing the material on the exposed surface of the conductive layer. The pre-clean process is thus self-defeating. By providing a metal surface in the contact which forms a conductive oxide upon exposure to air, the need to perform a pre-cleaning step prior to filling the contact is eliminated. The contact formation process therefore becomes simpler and more reliable.

The Group VIIB and Group VIII metals including ruthenium, rhodium, rhenium, osmium, and iridium are known to oxidize in air, at room temperature, and to form oxides having the general formula $MO_x$, where x is two or three, and M is one of the aforementioned metals. These metal oxides have resistivities on the order of 10 to 50 ohm-centimeters at 25° C. Therefore, at any point in the process after deposition of noble metal layer 14, substrate 10 can be removed from processing equipment and stored for a varying length of time until the next processing step is performed. Because the electrical resistivity of the oxide is low, electrical current conduction through the contact will not be impeded. For example, in the previously described process embodiment, substrate 10 could be stored after forming via opening 18 for almost any length of time, and then returned to processing with no required urgency to perform a metal deposition process immediately following a pre-cleaning step. Further, heating of the metal layer in air or oxygen to a temperature of about 400° C. increases the rate of oxide formation. This is an advantageous feature of the present invention. In a metal deposition process carried out in a low pressure CVD apparatus or a sputtering apparatus, residual oxygen is often present within the deposition chamber. If a preheating step is performed prior to metal deposition, the reaction of the metal with any residual oxygen remaining in the deposition system forms a thicker layer of conductive oxide in the contact. This is in contrast to processes of the prior art where any reaction with residual oxygen in the metal deposition chamber is undesirable.

Figure 5:
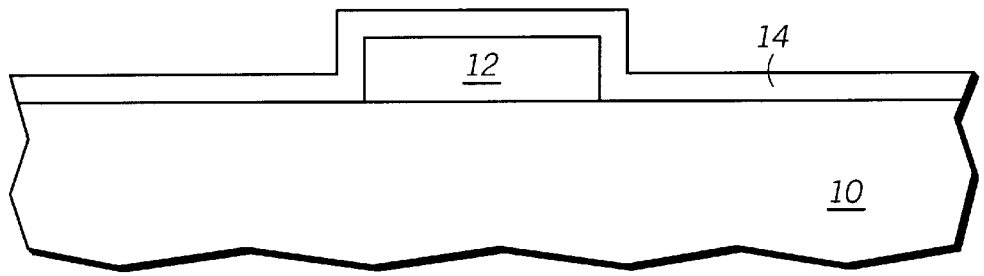
FIG. 5 illustrates, in cross-section, an alternative process step in accordance with another embodiment of the invention.

In addition to providing enhanced process flexibility, the process of the present invention also provides an electrically conductive structure having an expanded surface area. Shown in FIG. 5, in cross-section, is an alternative process step in accordance with another embodiment of the invention. In accordance with this embodiment, first metal layer 12 is deposited onto substrate 10, and photolithographically patterned and etched. Then, metal layer 14 is deposited to overlie first metal layer 12 and the surface of substrate 10. After blanket depositing metal layer 14, a variety of subsequent process steps can be used to increase the electrically conductive surface area of first metal layer 12.

Figure 6:
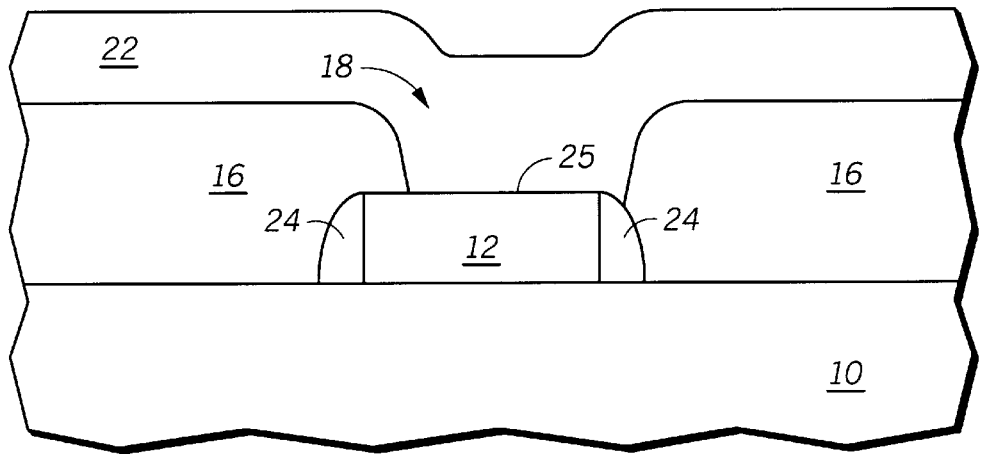
FIG. 6 illustrates, in cross-section, a contact via structure in accordance with a yet another embodiment of the invention having an expanded lateral surface area created by a Group VIIB or Group VIII metal oxide sidewall spacer.

In one method, metal layer 14 is anisotropically etched to form sidewall spacers 24 on first metal layer 12, as illustrated in FIG. 6. Sidewall spacers 24 using an anisotropic etching process which selectively removes metal layer 14, while not etching underlying first metal layer 12. For example, where first metal layer 12 is aluminum or an aluminum alloy and metal layer 14 is ruthenium, fluorine based etching chemistry can be used to selectively remove the ruthenium. After forming sidewall spacers 24, insulation layer 16 is deposited and contact via opening 18 is formed as previously described. Because sidewall spacers 24 are formed by an electrically conductive material, an expanded electrically conductive surface area 25 is provided for making an electrical connection to an overlying metal layer.

As illustrated in FIG. 6, via opening 18 exposes a portion of sidewall spacers 24 in addition to the upper surface of first metal layer 12. The exposure of a portion of sidewall spacers 24 is caused by a slight misalignment of the photolithographic mask previously used to define contact via opening 18. In the present invention, the misalignment does not result in an electrical contact having high contact resistance because sidewall spacers 24 are electrically conductive. Furthermore, any sputtering of sidewall spacer material during a sputter pre-cleaning process, prior to deposition of second metal layer 22, will not increase the electrical resistance of the via contact. Since the sidewall spacers are formed with an electrically conductive material, any redeposition of the spacer material onto the surface of first metal layer 12 will not impede electrical current. Thus, the placement of conductive sidewall spacers on first metal layer 12 permits the formation of an ohmic contact, even in cases where a slight photolithographic misalignment has occurred. The ability to achieve electrical contacts having high electrical conductivity, in the absence of precise photolithographic alignment, improves the functional yield of semiconductor devices fabricated in accordance with the present invention.

Figure 7:
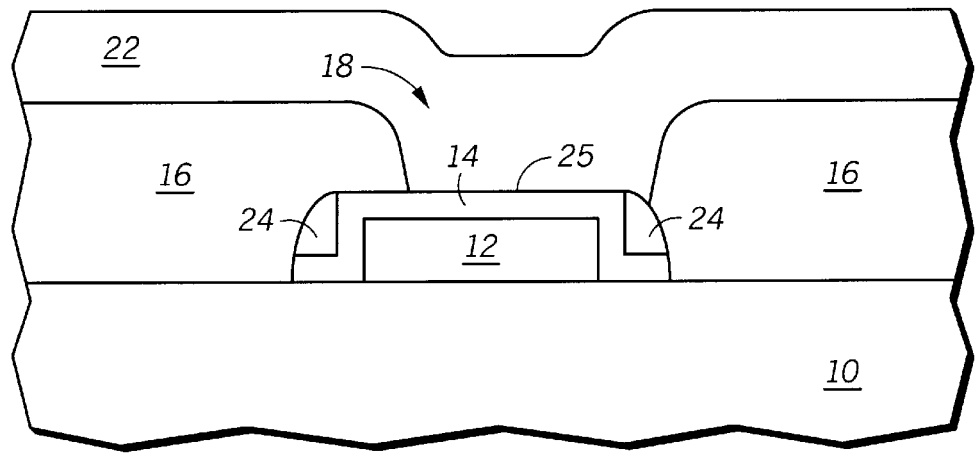
FIG. 7 illustrates, in cross-section, a contact via structure formed in accordance with a further embodiment of the invention having an expanded lateral surface area formed by a Group VIIB or Group VIII metal layer and a Group VIIB or Group VIII metal oxide sidewall spacer.

FIG. 7 illustrates, in cross-section, a contact via structure having an expanded electrically conductive surface area 25 formed in accordance with a further embodiment of the invention. In this embodiment, expanded surface area 25 includes a portion of metal layer 14 and a portion of sidewall spacers 24. To fabricate expanded surface area 25, subsequent to the blanket deposition step shown in FIG. 5, metal layer 14 is photolithographically patterned and etched. After etching metal layer 14, sidewall spacers 24 can be formed by either a subsequent deposition of a second Group VIIB or Group VIII metal layer followed by anisotropic etching, or by oxidizing the surface of metal layer 14. Additionally, sidewall spacers 24 can also be formed by the deposition and etching of a Group VIIB or Group VIII metal oxide. Since oxides of metal layer 14 are also electrically conductive, any oxidation of metal layer 14 will produce a conductive surface. Where sidewall spacers 24 are formed by the deposition of a second Group VIIB or Group VIII metal or Group VIIB or VIII metal oxide layer, the deposited layer must be differentially etchable with respect to metal layer 14.

Figure 8:
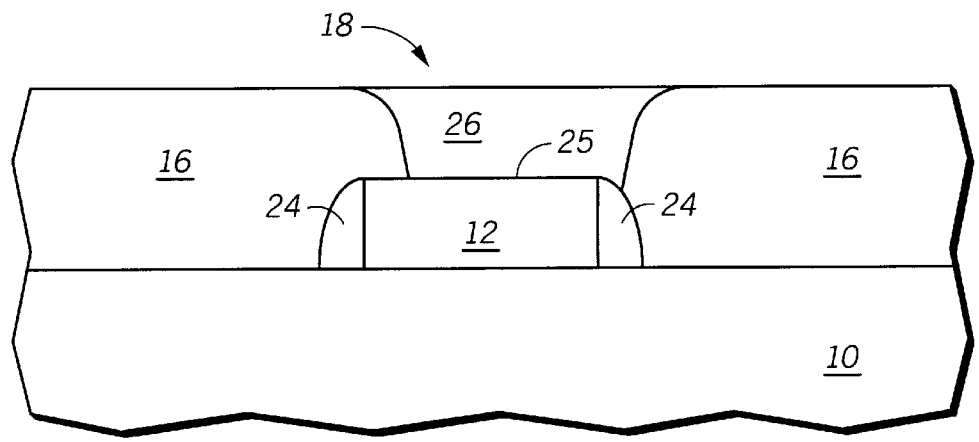
FIG. 8 illustrates, in cross-section, a contact via structure in accordance with the invention in which a via plug makes contact with an expanded lateral surface of a first metal layer.

The process of the invention is continued following either of the process steps shown in FIGS. 6 and 7, by removing portions of second metal layer 22 to form a via plug 26. As illustrated in FIG. 8, the surface of substrate 10 is planarized such that via plug 26 and insulation layer 16 form a continuous surface. The planarization step can be carried out using a planarization process, such as chemical-mechanical-polishing, or a nonselective plasma etching process, or the like. Once the planarization process is complete, another interconnect layer (not shown) can be formed on the planarized surface, and an electrical contact can be made through via plug 26 to first metal layer 12. The formation of expanded electrically conductive surface area 25 will provide a high performance metallized contact structure even though contact via opening 18 is not precisely positioned with respect to first metal layer 12.

Figure 9:
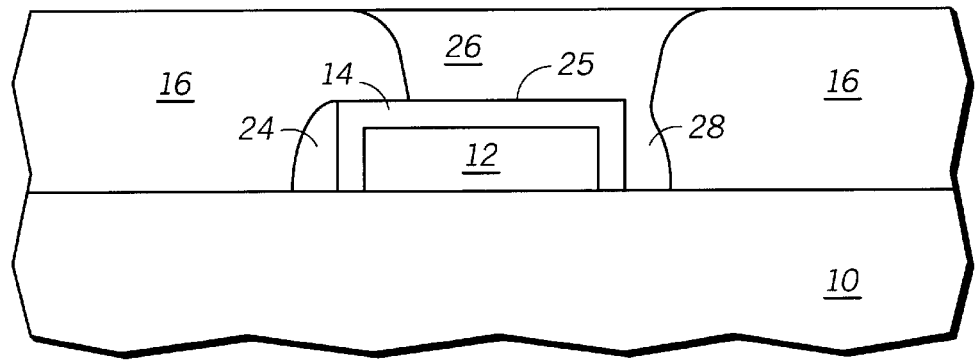
FIG. 9 illustrates, in cross-section, a contact via structure in accordance with the invention in which a via plug makes contact with a Group VIIB or Group VIII metal layer overlying a vertical surface of an underlying metal layer.

FIG. 9 illustrates in cross-section, yet another embodiment of a contact via structure formed in accordance with the invention. In this embodiment, an expanded surface area is obtained by removing a portion of sidewall spacers 24 prior to formation of via plug 26. To form expanded surface area 25, sidewall spacers 24 can comprise either an electrically conductive metal oxide, or alternatively, an insulating material, such as silicon dioxide, silicon nitride, oxynitride, and the like. After forming sidewall spacers 24, a photolithographic mask is defined and an etching process is used to remove a portion of sidewall spacers 24. The etching process must selectively remove the spacers and not the underlying metal. For example, where sidewall spacers 24 are formed by an insulating material, fluorine based etching chemistry can be used to remove the spacers selectively to the underlying metal. Further, where sidewall spacers 24 are ruthenium oxide, an oxygen based etching process can be used to selectively remove the spacers.

Once a portion of sidewall spacers 24 have been removed, second metal layer 22 is deposited to fill space 28 formerly occupied by the removed portion of sidewall spacer 24. Second metal layer 22 fills space 28 and overlies remaining exposed portions of metal layer 14. By filling space 28, an expanded electrically conductive surface area 25 is created, which includes a portion of the vertical edge of first metal layer 12 and the upper surface of first metal layer 12. Following the deposition of second metal layer 22, a planarization process is carried out to form via plug 26, as previously described.

Thus it is apparent that there has been provided, in accordance with the invention, a semiconductor device contact structure and process which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a metal lead can be encapsulated with a Group VIIB or Group VIII metal layer and protected from the formation of a non-electrically conductive oxide layer on the surface of the lead. The encapsulation process enables metals, such as tungsten, which have good electrical conductivity but readily form resistive oxides to be used as metal interconnects in semiconductor devices. Further, a Group VIIB or Group VIII metal or Group VIIB or Group VIII metal oxide layer can be deposited on the sidewall of the via opening, prior to sputter cleaning the surface of metal at the bottom of the via. Any material sputtered from the sidewall of the via during a precleaning process is electrically conductive and will not impair electrical performance of the via. It is therefore intended to include within the invention all such variations and modifications as fall within the scope of the appended claims and equivalents thereof.

We claim:

1. A process for forming a contact structure in a semiconductor device comprising:

provising a substrate having a patterned metal layer thereon;

depositing a Group VIIB or Group VIII metal selected from the group consisting of ruthenium, rhodium, rhenium, and iridium to overlie the patterned metal layer;

oxidizing the Group VIIB or Group VIII metal to form electrically conductive sidewall spacers on the patterned metal layer to increase the electrically conductive surface area of the patterned metal layer, wherein the sidewall spacers comprise an oxide of ruthenium, rhodium, rhenium, or iridium;

forming an insulation layer overlying the patterned metal layer;

etching an opening in the insulation layer exposing a portion of the patterned metal layer; and depositing a second metal layer into the opening to contact the patterned metal layer.

2. The process of claim 1, wherein the step of etching an opening comprises defining a photoresist pattern on the insulation layer and etching an opening in the insulation layer, wherein the opening exposes a portion of the sidewall spacer.

3. The process of claim 1, wherein the step of depositing the Group VIIB or Group VIII metal comprises a deposition process selected from the group consisting of sputter deposition and chemical vapor deposition.

4. The process of claim 1, wherein the patterned metal layer comprises a metal selected from the group consisting of a refractory metal, a refractory metal silicide, aluminum, copper, an aluminum-silicon alloy, and a copper-aluminum-silicon alloy.

5. The process of claim 1, wherein the second metal layer is a metal selected from the group consisting of a refractory metal, a refractory metal silicide, aluminum, copper, an aluminum-silicon alloy, and a copper-aluminum-silicon alloy.

6. A process for forming a contact structure in a semiconductor device comprising:

providing a semiconductor substrate having an electrically conductive body separated from the substrate by a first insulating layer, the electrically conductive body having a vertical side and a horizontal upper surface;

forming a Group VIIB or Group VIII metal layer on the vertical side and upper surface of the electrically conductive body to increase the upper surface area of the conductive body;

forming a second insulation layer on the Group VIIB or Group VIII metal layer;

etching an opening in the second insulation layer exposing a portion of the Group VIIB or Group VIII metal layer overlying the vertical side of the electrically conductive body;

exposing the Group VIIB or Group VIII metal to air and forming an oxide layer thereon; and directly forming a metal contact to the Group VIIB or Group VIII metal oxide layer, wherein the metal contacts a portion of the Group VIIB or Group VIII metal oxide layer overlying the vertical side of the electrically conductive body.

7. A process for forming a contact structure in a semiconductor device comprising:

providing a semiconductor substrate having an electrically conductive body separated from the substrate by a first insulating layer, the electrically conductive body having a vertical side and a horizontal upper surface, and wherein the conductive body comprises a semiconductor material;

forming a Group VIIB or Group VIII metal layer on the vertical side and upper surface of the electrically conductive body to increase the upper surface area of the conductive body;

forming a second insulation layer on the Group VIIB or Group VIII metal layer;

etching an opening in the second insulation layer exposing a portion of the Group VIIB or Group VIII metal layer; and forming a metal contact to the Group VIIB or Group VIII metal layer, wherein the metal contacts a portion of the Group VIIB or Group VIII metal layer overlying the vertical side of the electrically conductive body.

8. The process of claim 6, wherein the conductive body comprises a metal selected from the group consisting of a refractory metal, a refractory metal silicide, aluminum, copper, an aluminum-silicon alloy, and a copper-aluminum-silicon alloy.

9. The process of claim 6, wherein the Group VIIB or Group VIII metal layer is a metal selected from the group consisting of ruthenium, rhodium, rhenium, and iridium.

10. A process for forming a contact structure in a semiconductor device comprising providing a semiconductor substrate having an electrically conductive body separated from the substrate by a first insulating layer, the electrically conductive body having a vertical side and a horizontal upper surface;

forming a Group VIIB or Group VIII metal layer on the vertical side and upper surface of the electrically conductive body to increase the upper surface area of the conductive body;

oxidizing the Group VIIB or Group VIII metal layer to form electrically conductive sidewall spacers on the conductive body;

forming a second insulation layer on the oxidized Group VIIB or Group VIII metal layer;

etching an opening in the second insulation layer exposing a portion of the oxidized Group VIIB or Group VIII metal layer; and forming a metal contact to the oxidized Group VIIB or Group VIII metal layer, wherein the metal contacts a portion of the conductive sidewall spacers overlying the vertical side of the electrically conductive body.

11. A process for forming a contact structure in a semiconductor device comprising:

providing a substrate having a patterned first metal layer thereon;

depositing a Group VIIB or Group VIII metal layer selected from the group consisting of ruthenium, rhodium, rhenium, osmium, and iridium to overlie the first metal layer;

forming sidewall spacers on the Group VIIB or Group VIII metal layer;

forming a thick interlevel dielectric layer overlying the patterned first metal layer;

etching high-aspect ratio via holes in the dielectric layer to expose selected portions of the patterned first metal layer;

removing a portion of the sidewall spacers after forming the via holes; and directly depositing a second metal layer into the via holes.

12. The process of claim 11, wherein the first metal layer is a metal selected from the group consisting of a refractory metal, a refractory metal silicide, aluminum, copper, an aluminum-silicon alloy, and a copper-aluminum-silicon alloy.

13. The process of claim 11, wherein the second metal layer is a metal selected from the group consisting of a refractory metal, a refractory metal silicide, aluminum, copper, an aluminum-silicon alloy, and a copper-aluminum-silicon alloy.

14. A process for forming a contact structure in a semiconductor device comprising:

providing a substrate having a patterned first metal layer thereon;

depositing a Group VIIB or Group VIII metal layer selected from the group consisting of ruthenium, rhodium, rhenium, osmium, and iridium to overlie the first metal layer;

forming electrically conductive sidewall spacers on the Group VIIB or Group VIII metal layer to increase the electrically conductive surface area of the first metal layer, wherein forming electrically conductive sidewall spacers comprises oxidizing the Group VIIB or Group VIII metal to form a conductive metal oxide layer;

forming a thick interlevel dielectric layer overlying the patterned first metal layer;

etching high-aspect ratio via holes in the dielectric layer to expose selected portions of the conductive metal oxide layer; and directly depositing a second metal layer into the via holes.

* * * * *